(12) United States Patent
Homma

(10) Patent No.: US 12,487,529 B2
(45) Date of Patent: Dec. 2, 2025

(54) EXPOSING APPARATUS AND METHOD FOR MANUFACTURING ARTICLE

(71) Applicant: CANON KABUSHIKI KAISHA, Tokyo (JP)

(72) Inventor: Masato Homma, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 448 days.

(21) Appl. No.: 17/409,459

(22) Filed: Aug. 23, 2021

(65) Prior Publication Data

US 2022/0066324 A1   Mar. 3, 2022

(30) Foreign Application Priority Data

Aug. 27, 2020   (JP) ................................ 2020-143700

(51) Int. Cl.
*G03F 7/20*   (2006.01)
*G03F 7/00*   (2006.01)

(52) U.S. Cl.
CPC ........ *G03F 7/2002* (2013.01); *G03F 7/70258* (2013.01); *G03F 7/706* (2013.01); *G03F 7/70891* (2013.01); *G03F 7/70925* (2013.01)

(58) Field of Classification Search
CPC .... G03F 7/2002; G03F 7/70258; G03F 7/706; G03F 7/70891; F03F 7/70925
See application file for complete search history.

(56) References Cited

U.S. PATENT DOCUMENTS

| | | | | |
|---|---|---|---|---|
| 6,133,982 | A * | 10/2000 | Inoue | G03F 7/70691 355/53 |
| 6,731,371 | B1 | 5/2004 | Shiraishi | |
| 2005/0254025 | A1 | 11/2005 | Lallemant | |
| 2006/0209274 | A1 * | 9/2006 | To | G03F 7/70908 355/18 |
| 2006/0232754 | A1 * | 10/2006 | Lallemant | G03F 7/70933 355/53 |
| 2014/0185026 | A1 * | 7/2014 | Sasaki | G03F 7/70933 355/77 |
| 2018/0275533 | A1 * | 9/2018 | Shirato | G03F 7/22 |

FOREIGN PATENT DOCUMENTS

| | | | |
|---|---|---|---|
| JP | 2001118783 A | 4/2001 | |
| JP | 2005333152 A | 12/2005 | |
| JP | 2019200364 A | 11/2019 | |

* cited by examiner

*Primary Examiner* — Jonathan Johnson
*Assistant Examiner* — Jayson D Cosgrove
(74) *Attorney, Agent, or Firm* — Canon U.S.A., Inc. IP Division

(57) ABSTRACT

An exposing apparatus for exposing a substrate to transfer a pattern formed on an original to the substrate by using exposure light from a light source includes a projecting optical system configured to guide the exposure light having passed through the original to the substrate, a measuring unit configured to measure a position of the substrate in a first direction perpendicular to a substrate surface of the substrate by making measurement light incident on the substrate surface and to receive the measurement light reflected by the substrate surface, and a traveling direction setting means configured to set a traveling direction of first gas so as to supply the first gas toward a first space between the projecting optical system and the substrate from a first gas supplying mechanism, in which the first space is different from a second space through which the measurement light passes.

16 Claims, 4 Drawing Sheets

EXPOSING APPARATUS AND METHOD FOR MANUFACTURING ARTICLE

BACKGROUND

Field of the Disclosure

The present disclosure relates to an exposing apparatus and a method for manufacturing an article.

Description of the Related Art

Conventionally, it has been known that outgas is generated from a photoresist coated on a substrate when the substrate is exposed in an exposing apparatus.

The outgas generated in such a manner reacts with an impurity such as an acid, a base or an organic compound contained in an atmosphere within the exposing apparatus to generate a clouding on an optical element of an projecting optical system in the vicinity of the substrate, thereby an optical performance of the optical element, and consequently an exposure performance of the exposing apparatus may deteriorate.

In order to prevent such outgas from reaching the optical element of the projecting optical system, there is known an exposing apparatus including a gas supplying mechanism for supplying clean gas for blowing off the outgas.

However, in the exposing apparatus, since an space between the substrate and the projecting optical system is relatively small and gas for air-conditioning is also supplied, it is difficult to supply the clean gas with a large flow volume for blowing off the outgas to the space at a high flow rate.

Japanese Patent Application Laid-Open No. 2005-333152 discloses an exposing apparatus in which gas is supplied to a space between a substrate and a projecting optical system by changing an traveling direction of the gas with utilizing the Coanda effect to suppress a deterioration of an exposure accuracy.

On the other hand, in the exposing apparatus, provided is a measuring mechanism for measuring a position of the substrate in a direction perpendicular to a substrate surface of the substrate by making measurement light be incident on the substrate surface in the space between the substrate and the projecting optical system and receiving the measurement light reflected by the substrate surface.

Further, when the clean gas for blowing off the outgas is supplied to the space between the substrate and the projecting optical system by using the Coanda effect, as the exposing apparatus of Japanese Patent Application Laid-Open No. 2005-333152, an entrainment of gas for air-conditioning with a temperature, a humidity, a gas composition or the like different from those of the clean gas occurs.

When the clean gas for blowing off the outgas travels to an optical path of the measurement light by the measurement mechanism with entraining the gas for air-conditioning, a refractive index becomes non-uniform in an atmosphere within the optical path.

As a result, a measurement accuracy of the position of the substrate, and consequently the exposure accuracy may deteriorate by an occurrence of a fluctuation of the measurement light.

SUMMARY

It is an object of the present disclosure to provide an exposing apparatus which can suppress a deterioration of an exposure performance by supplying gas for suppressing a deterioration of an optical performance so as to suppress a deterioration of a measurement accuracy.

The exposing apparatus according to the present invention for exposing a substrate to transfer a pattern formed on an original to the substrate by using exposure light from a light source includes a projecting optical system configured to guide the exposure light having passed through the original to the substrate, a measuring unit configured to measure a position of the substrate in a first direction perpendicular to a substrate surface of the substrate by making measurement light incident on the substrate surface and to receive the measurement light reflected by the substrate surface, and a traveling direction setting means configured to set a traveling direction of first gas so as to supply the first gas toward a first space between the projecting optical system and the substrate from a first gas supplying mechanism, in which the first space is different from a second space through which the measurement light passes.

Further features of the present invention will become apparent from the following description of exemplary embodiments with reference to the attached drawings.

DESCRIPTION OF THE EMBODIMENTS

Figure 1:
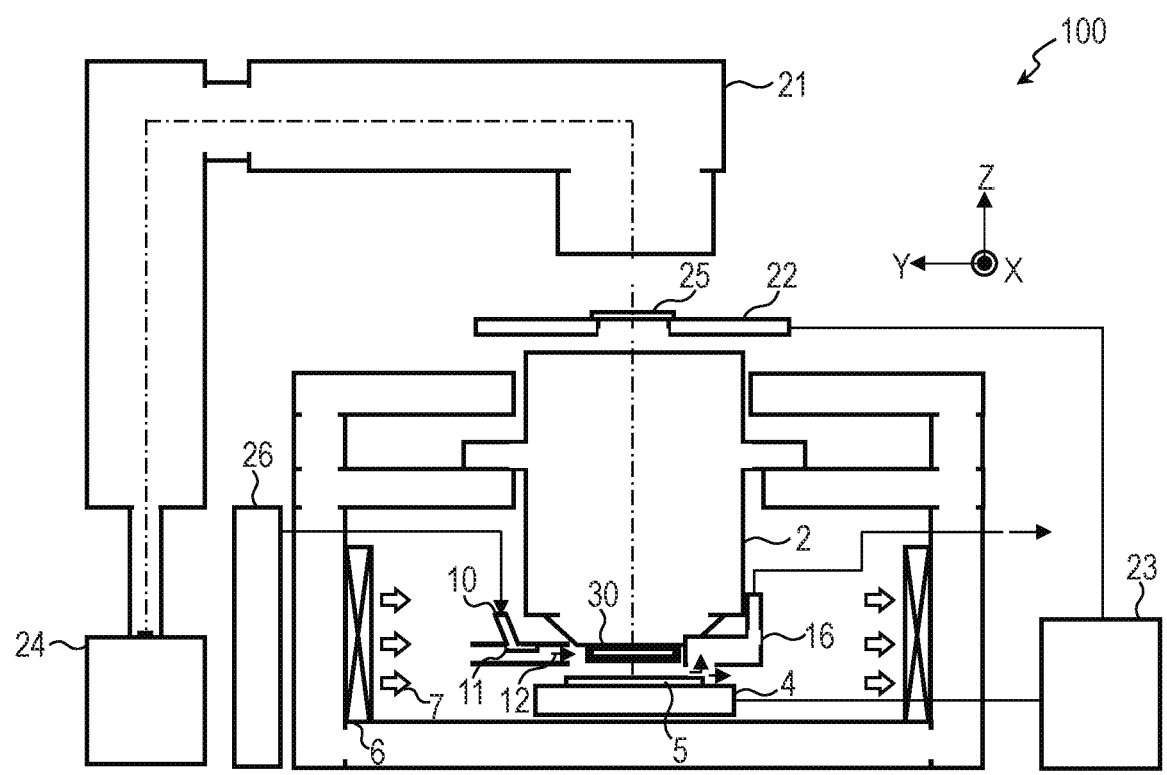
FIG. 1 is a schematic cross-sectional view of an exposing apparatus according to a first embodiment of the present invention.

The exposing apparatus according to the present invention will be described in detail below with reference to the attached drawings. In order to facilitate understanding of the present invention, the following drawings are drawn in a scale different from the actual scale.

In the following description, a direction perpendicular to the substrate mounting surface of the substrate stage is defined as the Z direction, and two directions orthogonal (perpendicular) to each other in the substrate mounting surface are defined as the X direction and the Y direction, respectively.

First Embodiment

As an apparatus used in a lithography process for manufacturing a liquid crystal panel, a semiconductor device or the like, there is known an exposing apparatus in which a pattern of an original illuminated by an illuminating optical system is projected on a substrate (wafer) via a projecting optical system to expose the substrate.

The substrate used in the exposing apparatus is coated with a photoresist, for example. Outgas is generated from the photoresist on the substrate when exposing the substrate.

The outgas generated from the photoresist on the substrate reacts with an impurity such as an acid, a base or an organic compound contained in an atmosphere within the exposing apparatus or a coating formed on a surface of an optical element.

Thereby, a clouding may be generated in the vicinity of the substrate, particularly on an optical surface of the optical element arranged closest to the substrate in the projecting optical system.

Then, when the clouding is generated on the optical element, an accuracy of a pattern of a mask projected on the substrate may deteriorate due to an insufficient actual exposure amount, or a generation of uneven illuminance or flare.

Further, in addition to the photoresist on the substrate, outgas is also generated from a resin component, an adhesive, a grease or a cleaning residue in a metal component included in, for example, a substrate stage and a housing of the exposing apparatus.

Therefore, the outgas generated from such member may also generate the clouding on the optical element as well as the outgas generated from the photoresist on the substrate.

In order to prevent such impurity and outgas from reaching the optical element in the exposing apparatus, conventionally, there is known the exposing apparatus including a gas supplying mechanism such as an air nozzle for blowing off the impurity and the outgas.

Further, in order to blow off the outgas by supplying the gas from the air nozzle, it is generally advantageous to supply the gas at a high flow rate to an entire space between the substrate and the optical element.

Therefore, it is preferred that clean gas, such as clean dry air, nitrogen gas or humidity-controlled clean air, with a large flow volume is supplied from the air nozzle.

On the other hand, in a conventional exposing apparatus, provided is a measuring mechanism for measuring a position of the substrate in a direction perpendicular to a substrate surface of the substrate by making measurement light be incident on the substrate surface between the substrate and the projecting optical system and receiving the measurement light reflected by the substrate surface.

Further, since air-conditioning is generally performed in the space within the exposing apparatus, gas (for example, air) for air-conditioning is supplied to the space between the substrate and the projecting optical system.

Here, a temperature, a humidity or a gas composition may be different between the gas for air-conditioning and the clean gas supplied to blow off the outgas.

In this case, when supplying the clean gas for blowing off the outgas included in the space between the substrate and the projecting optical system, a refractive index becomes non-uniform in the atmosphere within the space since the supplied clean gas and the gas for air-conditioning are mixed with each other.

As a result, when making the measurement light for measuring the position of the substrate be incident on such space, a measurement accuracy of the position of the substrate, and consequently the exposure accuracy may deteriorate by an occurrence of a fluctuation of the measurement light.

In order to solve such problem, conventionally, an exposing apparatus including a substrate stage for exposing on which the substrate is mounted for exposing and a substrate stage for measuring on which the substrate is mounted for measuring the position of the substrate is used.

In such exposing apparatus, the clean gas for blowing off the outgas is not supplied to the substrate stage for measuring when the position of the substrate is measured, while it is supplied to the substrate stage for exposing when the substrate is exposed.

Thereby, the deterioration of the exposure accuracy can be suppressed by suppressing the generation of the clouding on the optical element with maintaining the measurement accuracy of the position of the substrate.

However, a cost and a size increase since it is necessary to provide two substrate stages in such exposing apparatus.

On the other hand, in order to solve the above-described problem, conventionally, an exposing apparatus is used in which an adjustment of the temperature and the humidity to become the same is performed between the gas for air-conditioning and the clean gas supplied to blow off the outgas.

However, it is generally required that an error of the measurement result of the position accompanied by the fluctuation of the measurement light is made be 1 nm or less in order to maintain the measurement accuracy of the position of the substrate in the exposing apparatus.

In this case, such adjustment is difficult since it may be required that a temperature difference between the respective gases is made between 0.01° C. and 0.001° C. or less and a relative humidity difference between the respective gases is made between 1% and 0.1% or less.

It is also possible to conceive a method of supplying gas for air-conditioning after removing an impurity such as an acid, a base or an organic compound via a filter so as to improve a cleanliness to the same degree as that of clean gas supplied to blow off the outgas.

However, in general, it is difficult to improve the cleanliness of the gas for air-conditioning to the same degree as that of the clean gas supplied to blow off the outgas only via the filter.

Even if the cleanliness of the gas for air-conditioning can be improved to the same degree as that of the clean gas for blowing off the outgas, the outgas may be mixed with the improved gas for air-conditioning before it reaches the space between the substrate and the projecting optical system.

In addition, since the space between the substrate and the projecting optical system is relatively small in the exposing apparatus, it is difficult to supply gas with a high flow volume at a high flow rate since an increase of pressure occurs when the gas is supplied to such space.

There is also known a method utilizing the Coanda effect in order to supply the clean gas for blowing off the outgas to such small space between the substrate and the projecting optical system.

Since the gas for air-conditioning is entrained when supplying the clean gas for blowing off the outgas by using the Coanda effect, both gases can be supplied to the space at a large flow rate with mixing them with each other.

However, in this case, if the gas for air-conditioning absorbing a heat from a heat source, for example the substrate stage, disposed in the vicinity of the substrate is entrained, the temperature may become non-uniform between the both gases.

Thereby, since the refractive index becomes non-uniform in the atmosphere within the space between the substrate and the projecting optical system, a measurement accuracy of the position of the substrate, and consequently the exposure accuracy may deteriorate by the occurrence of the fluctuation of the measurement light for measuring the position of the substrate which travels in the space.

In addition, when the clean gas for blowing off the outgas is supplied by utilizing the Coanda effect, the outgas included within and around the space between the substrate and the projecting optical system may be also entrained in addition to the gas for air-conditioning.

Therefore, the clouding may be generated on the optical element included in the projecting optical system.

In view of the above, the present invention provides an exposing apparatus which can suppress the deterioration of the exposure performance by supplying gas for suppressing the deterioration of the optical performance so as to suppress the deterioration of the measurement accuracy by employing the following structures.

FIG. 1 shows a schematic cross-sectional view of an exposing apparatus 100 according to a first embodiment of the present invention.

The exposing apparatus 100 according to the present embodiment includes a projecting optical system 2, a substrate stage 4, second gas supplying mechanism 6, a first gas supplying mechanism 10, an exhausting mechanism 16, an illuminating optical system 21, an original stage 22, a controller 23, a light source 24, an air-conditioning unit 26 and a measuring device 30 (measuring unit).

The illuminating optical system 21 illuminates the original 25 held on the original stage 22 by using exposure light from the light source 24.

The projecting optical system 2 projects an image of a pattern formed on the original 25 onto the substrate 5 to transfer the pattern by guiding the exposure light having passed through the original 25 to the substrate 5 held on the substrate stage 4.

The substrate stage 4 and the original stage 22 hold the substrate 5 and the original 25, respectively, and are moved in the Y direction by the controller 23.

The measuring device 30 is arranged in the vicinity of the projecting optical system 2, and measures a position of the substrate 5 in the Z direction, namely a focus.

The second gas supplying mechanism 6 performs air-conditioning by supplying second gas 7 to at least a part of a space in which the projecting optical system 2, the substrate stage 4 and the measuring device 30 are arranged.

The first gas supplying mechanism 10 is arranged in the vicinity of the projecting optical system 2, and supplies first gas 12 to a space between the projecting optical system 2 and the substrate 5 via a gas supplying port 11. The first gas 12 supplied from the first gas supplying mechanism 10 is exhausted from the exhausting mechanism 16.

The air-conditioning unit 26 supplies the first gas 12, such as clean dry air, clean air or nitrogen gas, to the first gas supplying mechanism 10.

As described in detail below, the first gas supplying mechanism 10 arranged in the vicinity of the projecting optical system 2 supplies the first gas 12 to the space between the projecting optical system 2 and the substrate 5 in the exposing apparatus 100 according to the present embodiment.

Thereby, it can be suppressed that a clouding is generated on an optical element 3 arranged closest to the substrate 5 in the projecting optical system 2 by the outgas generated from the photoresist on the substrate 5 or various components provided in the substrate stage 4, the projecting optical system 2, the measuring device 30 and a housing for holding them.

Next, characteristic structures of the exposing apparatus 100 according to the present embodiment are described.

Figure 2A:
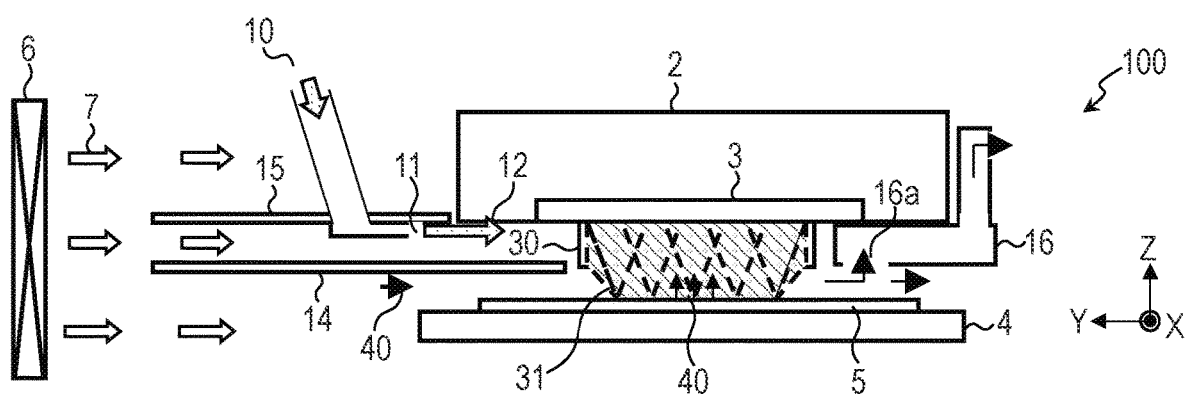
FIG. 2A is a partially enlarged view of the exposing apparatus according to the first embodiment projected on the YZ cross section.

FIG. 2A shows a partially enlarged view of the exposing apparatus 100 according to the present embodiment projected on the YZ cross section.

Figure 2B:
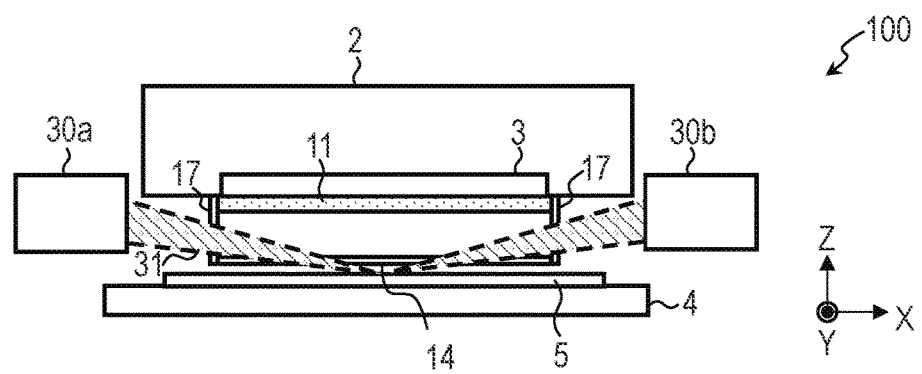
FIG. 2B is a partially enlarged view of the exposing apparatus according to the first embodiment projected on the XZ cross section.

Further, FIG. 2B shows a partially enlarged view of the exposing apparatus 100 according to the present embodiment projected on the XZ cross section.

As shown in FIG. 2A, the second gas 7 is supplied from the second gas supplying mechanism 6 in the exposing apparatus 100 according to the present embodiment.

Further, the first gas 12 is supplied from the first gas supplying mechanism 10 arranged in the vicinity of the projecting optical system 2.

The first gas supplying mechanism 10 is provided with the gas supplying port 11 such that the first gas 12 is blown out along the Y direction.

As shown in FIGS. 2A and 2B, the measuring device 30 for measuring the position in the Z direction of the substrate 5, namely the focus, is arranged in the vicinity of the projecting optical system 2 in the exposing apparatus 100 according to the present embodiment.

Specifically, a measurement light 31 emitted from a light projecting unit 30a included in the measuring device 30 passes through a space between the optical element 3 and the substrate 5. Thereafter, the measurement light 31 is obliquely incident on a substrate surface of the substrate 5 in the XZ cross section (second cross section) parallel to the Z direction (first direction) perpendicular to the substrate surface of the substrate 5 and a traveling direction of the measurement light 31.

A light receiving unit 30b included in the measuring apparatus 30 receives the measurement light 31 reflected by the substrate surface of the substrate 5, thereby the position in the Z direction of the substrate 5 can be measured.

As shown in FIGS. 2A and 2B, the gas supplying port 11 (traveling direction setting means) is provided such that the first gas 12 supplied from the first gas supplying mechanism 10 travels through a gap in the Z direction between the optical element 3 and an optical path of the measurement light 31.

That is, the traveling direction of the first gas 12 is set by the gas supplying port 11 such that the first gas 12 travels toward the space between the optical element 3 arranged closest to the projecting optical system 2 and the optical path of the measurement light 31 among the space between the projecting optical system 2 and the substrate 5 on the substrate stage 4.

It is preferred that a width in the X direction of the gas supplying port 11 is equal to or larger than an effective irradiated region on an exit surface (surface at the substrate 5 side) of the optical element 3.

The first gas supplying mechanism 10 is connected to the air-conditioning unit 26 formed by a solenoid valve, an adjusting unit, a flow meter, a pressure gauge, a mass flow meter and the like via a piping member, such as a tube, a manifold, a joint and a choke made of a resin or a metal.

The first gas 12 is supplied from the air-conditioning unit 26 to the first gas supplying mechanism 10 via such piping members.

The piping member between the air-conditioning unit 26 and the first gas supplying mechanism 10 may be provided so as to pass through a space in which the second gas 7 is supplied.

In this case, the second gas 7 is brought into contact with the provided piping member, thereby such an advantage that the temperature of the first gas 12 supplied from the air-conditioning unit 26 to the first gas supplying mechanism 10 can be made equal to that of the second gas 7 can be obtained.

As the first gas 12 supplied from the first gas supplying mechanism 10 in the exposing apparatus 100 according to the present embodiment, clean gas containing almost no impurity, such as an acid, a base, an organic compound or the like, is used.

It is preferred that the first gas 12 is clean dry air containing few impurities, such as an acid, a base, an organic compound or the like.

Further, the first gas 12 may be humidity-controlled clean air or inert gas different from the second gas 7, such as nitrogen gas. Furthermore, the first gas 12 may be mixture gas of the humidity-controlled clean air and the inert gas, such as the nitrogen gas.

As the second gas 7 supplied from the second gas supplying mechanism 6 in the exposing apparatus 100 according to the present embodiment, gas for air-conditioning in which a temperature thereof is adjusted, for example air, is generally used.

Although the cleanliness of the second gas 7 may be lower than that of the first gas 12, it is preferred that an impurity, such as an acid, a base, an organic compound or the like, is removed to some extent in the second gas 7 by using a filter or the like since the second gas 7 travels in the vicinity of the optical element 3.

As described above, the outgas 40 is generated from a resin component, an adhesive, a grease or a cleaning residue in a metal component included in the substrate stage 4 and in the vicinity of the projecting optical system 2.

The generated outgas 40 may move between the substrate 5 and the optical element 3 along the flow of the second gas 7.

Further, the substrate 5 is coated with a photoresist, and the outgas 40 is also generated from the photoresist by exposing the substrate 5.

The outgas 40 generated from the photoresist may also move between the substrate 5 and the optical element 3 along the flow of the second gas 7.

Next, effects obtained by the characteristic structures in the exposing apparatus 100 according to the present embodiment are described.

First, a generation of the clouding on the optical element 3 can be suppressed in the exposing apparatus 100 according to the present embodiment.

That is, as described above, it is preferred that the first gas 12 supplied from the gas supplying port 11 travels so as to cover at least a part of the optical element 3, particularly the effective irradiated region on the exit surface of the optical element 3, in the exposing apparatus 100 according to the present embodiment.

Thereby, it can be suppressed that the outgas 40 traveling in the vicinity of the optical element 3 along the flow of the second gas 7 reaches the optical element 3 as described above.

Even if a flow rate of the first gas 12 is so small that the first gas 12 does not directly reach the optical element 3, an effect of reducing a concentration of the outgas 40 traveling in the vicinity of the optical element 3 can be obtained by the travel of the first gas 12.

On the other hand, it is preferred that the flow rate of the first gas 12 is large enough to reach the optical element 3 even when the second gas 7 is supplied.

Further, it is further preferred that the flow rate of the first gas 12 is so large that the first gas 12 can completely cover the effective irradiated region on the exit surface of the optical element 3 in order to prevent the outgas 40 and gas other than the first gas 12 from reaching the optical element 3.

That is, the flow rate of the first gas 12 is preferably equal to or higher than the flow rate of the second gas 7, for example, and is more preferably higher than a moving speed of the substrate stage 4.

An occurrence of the fluctuation in the measurement light 31 by the measuring device 30 can be suppressed in the exposing apparatus 100 according to the present embodiment.

As described above, the first gas 12 is supplied from the gas supplying port 11 so as to travel through the gap in the Z direction between the optical element 3 and the optical path of the measurement light 31.

That is, the occurrence of the fluctuation accompanied by the travel of the first gas 12 in the atmosphere of the optical path in which the measurement light 31 travels can be suppressed since the first gas 12 is supplied so as to suppress a contact with the measurement light 31.

It is preferred that the first gas 12 travels so as to intersect with the optical path of the measurement light 31 in the XY cross section (first cross section) parallel to the substrate surface of the substrate 5 in the exposing apparatus 100 according to the present embodiment.

In other words, it is preferred that the gas supplying port 11 sets the traveling direction of the first gas 12 so as to intersect with the optical path of the measurement light 31 in the XY cross section parallel to the substrate surface of the substrate 5 in the exposing apparatus 100 according to the present embodiment.

Further, it is more preferred that the first gas 12 travels at an angle of between 45° and 90° with respect to the optical path of the measurement light 31 in the XY cross section parallel to the substrate surface of the substrate 5 in the exposing apparatus 100 according to the present embodiment.

In other words, it is more preferred that the gas supplying port 11 sets the traveling direction of the first gas 12 so as to travels at an angle of between 45° and 90° with respect to the optical path of the measurement light 31 in the XY cross section parallel to the substrate surface of the substrate 5 in the exposing apparatus 100 according to the present embodiment.

The above-described effect of suppressing the occurrence of the fluctuation in the measurement light 31 varies by a difference between the traveling direction of the first gas 12 and that of the second gas 7 and by a change in diffusivity of the first gas 12 according to a difference between the flow rate of the first gas 12 and that of the second gas 7.

That is, the traveling direction of the first gas 12 preferably forms an angle of 45° or less with respect to that of the second gas 7, and is most preferably the same as that of the second gas 7 in the exposing apparatus 100 according to the present embodiment.

In other words, it is preferred that the gas supplying port 11 sets the traveling direction of the first gas 12 so as to form the angle of between 0° and 45° with respect to that of the second gas 7 in the exposing apparatus 100 according to the present embodiment.

Further, it is preferred that the flow rate of the first gas 12 is substantially the same as that of the second gas 7.

Thereby, a contact of the first gas 12 with the measurement light 31 can be suppressed by suppressing a diffusion of the first gas 12.

Although the respective flow rates of the first gas 12 and the second gas 7 may be different from each other, it is preferred to set them such that the first gas 12 can reach the optical element 3 in order to further improve the above-described effect.

As shown in FIG. 2A, flow straightening plates 14 and 15 (flow straightening member) may be provided such that the second gas 7 and the first gas 12 travel along substantially the same direction in the exposing apparatus 100 according to the present embodiment.

Specifically, the flow straightening plates 14 and 15 form a tubular structure with side plates 17 to connect them to each other as shown in FIG. 2B, and set the traveling direction of the second gas 7 such that it forms an angle of between 0° and 45° with respect to the traveling direction of the first gas 12.

That is, the traveling direction and the flow rate of the second gas 7 can be easily controlled by providing the flow straightening plates 14 and 15.

Further, it is preferred that respective surfaces of the flow straightening plate 15, the projecting optical system 2 and the optical element 3 contacting with the first gas 12, which are provided between the gas supplying port 11 and the optical element 3 in the Y direction, are formed as the same plane such that the flow of the first gas 12 is straightened without diffusing.

In other words, it is preferred that a part of the exit surface of the optical element 3 and an end surface of a housing of the projecting optical system 2 at the substrate 5 side between the gas supplying port 11 and the space between the optical element 3 and the optical path of the measurement light 31 forms a plane.

By forming the respective surfaces as the same plane, the first gas 12 supplied from the gas supplying port 11 can easily travel to the optical element 3 along the respective surfaces to suppress the diffusion of the first gas 12.

The respective surfaces are not limited to the same plane, and at least a part of them may be formed in a concave shape upward in the Z direction.

As shown in FIG. 2A, the exhausting mechanism 16 for sucking gases including the outgas 40 within the space between the optical element 3 and the substrate 5 may be provided in the exposing apparatus 100 according to the present embodiment.

The exhausting mechanism 16 may be formed such that each of the second gas 7 and the first gas 12 travels in a predetermined direction between the substrate 5 and the optical element 3.

That is, an exhausting port 16a of the exhausting mechanism 16 is not limited to the Z direction, and may be formed along a different direction, such as the Y direction.

Figure 3A:
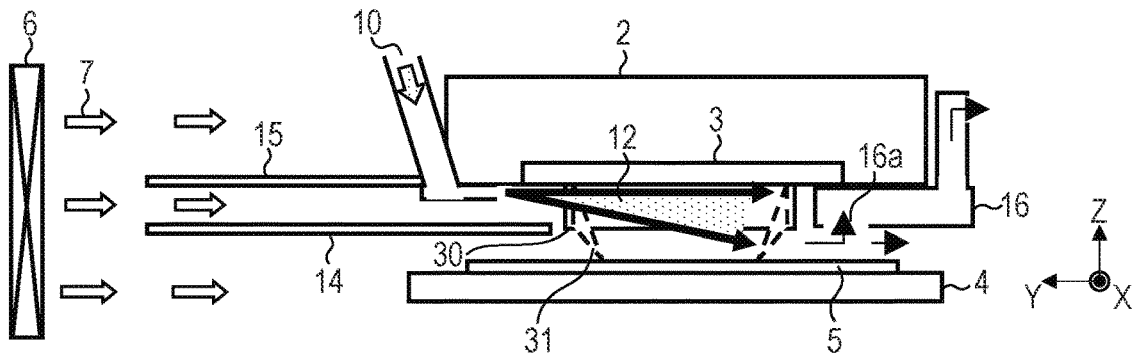
FIG. 3A is a partially enlarged view of the exposing apparatus according to a modified example of the first embodiment projected on the YZ cross section.

FIG. 3A shows a partially enlarged view of the exposing apparatus according to a modified example of the present embodiment projected on the YZ cross section.

As shown in FIG. 3A, the first gas 12 is supplied so as to be radially blown out obliquely and downwardly from the gas supplying port 11 in the exposing apparatus according to the modified example of the present embodiment.

Since the first gas 12 can radially travels obliquely and downwardly in this way to form the flow of the outgas 40 so as to be spaced away from the optical element 3, an arrival of the outgas 40 to the optical element 3 can be suppressed more advantageously.

The first gas 12 is radially blown out obliquely and downwardly from the gas supplying port 11 in the exposing apparatus according to the modified example of the present embodiment. However, the present invention is not limited to this, namely the first gas 12 may be linearly blown out obliquely and downwardly from the gas supplying port 11.

That is, the gas supplying port 11 may be set such that the traveling direction of the first gas 12 is directed toward the substrate surface in the YZ cross section (third cross section) including the Z direction perpendicular to the substrate surface of the substrate 5 and the traveling direction of the first gas 12 in the exposing apparatus according to the modified example of the present embodiment.

Figure 3B:
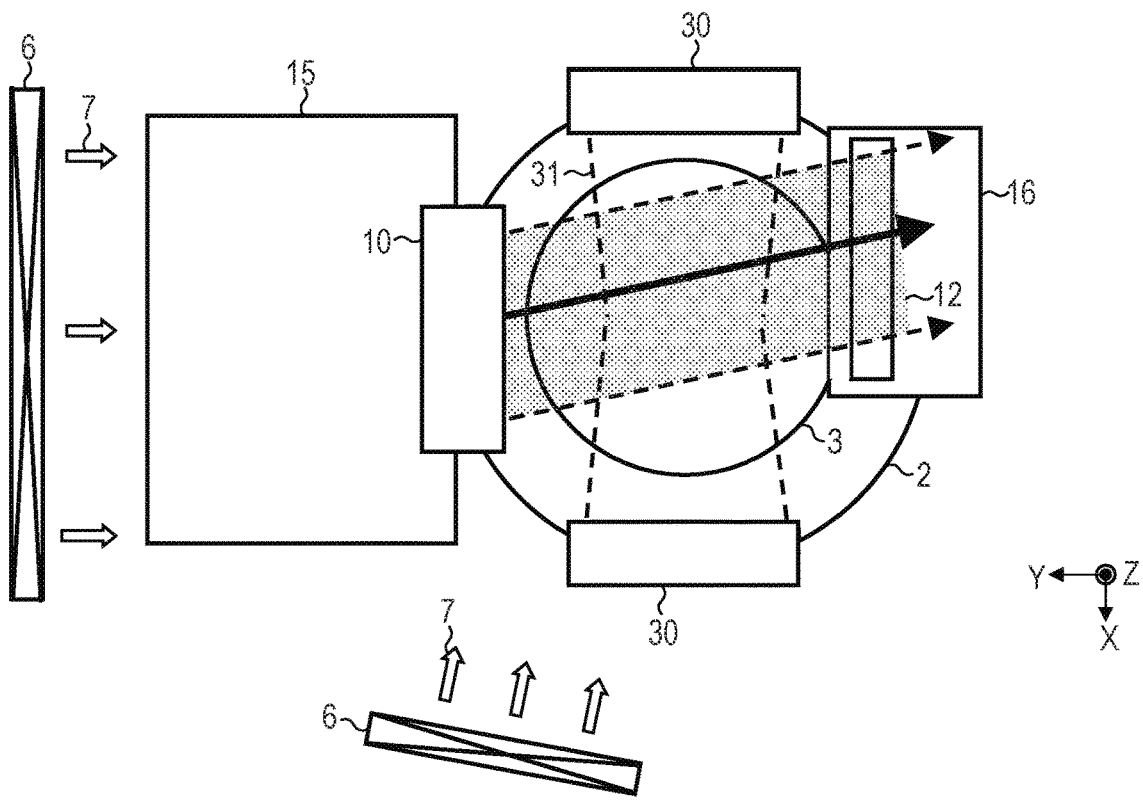
FIG. 3B is a partially enlarged view of the exposing apparatus according to a modified example of the first embodiment projected on the XY cross section.

FIG. 3B shows a partially enlarged view of the exposing apparatus according to another modified example of the present embodiment projected on the XY cross section.

As shown in FIG. 3B, two second gas supplying mechanisms 6 are provided according to a demand in the supply of the second gas 7 in the exposing apparatus according to the another modified example of the present embodiment.

For example, when the traveling direction of the second gas 7 is substantially parallel to the scanning direction (namely, the Y direction) of the substrate stage 4, a drag force accompanied by the flow of the second gas 7 may be generated against the substrate stage 4 when the substrate stage 4 moves.

In order to suppress the generation of such drag force, there is a case that a plurality of second gas supplying mechanisms 6 for supplying the second gas 7 along traveling directions different from each other are provided, as the exposing apparatus according to another modified example of the present embodiment.

Thereby, at least one second gas supplying mechanism 6 can set the traveling direction of the second gas 7 such that it becomes non-parallel to the scanning (moving) direction (second direction) of the substrate stage 4 in the XY cross section parallel to the substrate surface of the substrate 5.

In this case, the first gas supplying mechanism 10 may be provided such that the angle formed by the traveling direction of the first gas 12 with respect to at least one of the traveling directions of the second gas 7 is set between 0° and 45°.

Further, the exhausting mechanism 16 may be arranged in accordance with such traveling direction of the first gas 12.

When the flow straightening plate for setting the traveling direction of the second gas 7 is provided in the exposing apparatus according to the another modified example of the present embodiment, it may be provided between the at least one second gas supplying mechanism 6 and the space between the optical element 3 and the substrate 5.

Thereby, at least one of the traveling directions of the second gas 7 can be set such that it forms the angle of between 0° and 45° with respect to the traveling direction of the first gas 12.

In addition, with respect to a size of the gas supplying port 11 formed in the exposing apparatus 100 according to the present embodiment, first, it is considered that a distance in the Z direction between the substrate 5 and the optical element 3 is between several mm and several tens mm.

Further, when the shape of the gas supplying port 11 is rectangular in the XZ cross section as shown in FIG. 2B, it is preferred to determine the size of the gas supplying port 11 so as to be spaced away from the measurement light 31 by 1 mm or more in the Z direction in the gap between the optical element 3 and the optical path of the measurement light 31.

Furthermore, it is preferred that the width in the X direction of the gas supplying port 11 is designed so as to be larger than the effective irradiated region of the exit surface of the optical element 3.

Here, with respect to the gap in the Z direction between the optical element 3 and the optical path of the measurement light 31, the effect of suppressing the generation of the clouding on the optical element 3 can be further improved by increasing the supplying amount of the first gas 12 such that the distance in the Z direction between the first gas 12 and the measurement light 31 becomes small.

On the other hand, with respect to the gap in the Z direction between the optical element 3 and the optical path of the measurement light 31, the effect of suppressing the occurrence of the fluctuation in the measurement light 31 due to the supply of the first gas 12 can be further improved by increasing the distance in the Z direction between the first gas 12 and the measurement light 31.

Figure 3C:
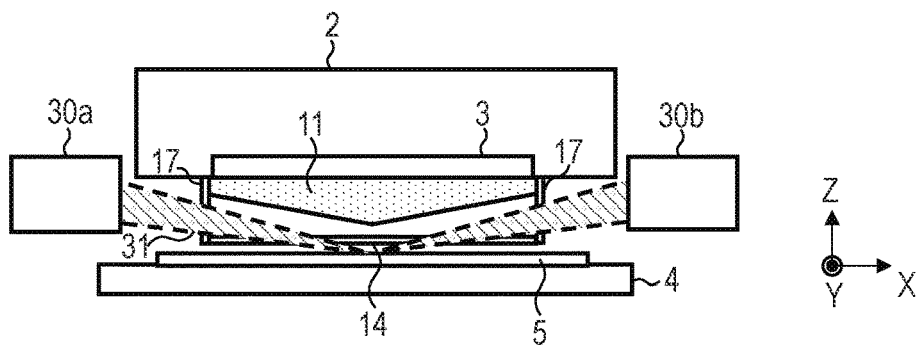
FIG. 3C is a partially enlarged view of the exposing apparatus according to a modified example of the first embodiment projected on the XZ cross section.

In order to further suppress the generation of the clouding on the optical element 3 by supplying the first gas 12 with a larger amount, the shape of the gas supplying port 11 in the XZ cross section can be formed into a triangle shape as shown in FIG. 3C.

As described above, the gas supplying port 11 for setting the traveling direction of the first gas 12 is provided such that the first gas 12 is supplied from the first gas supplying mechanism 10 toward the space between the optical element 3 and the optical path of the measurement light 31 in the exposing apparatus 100 according to the present embodiment.

Thereby, the first gas 12 for suppressing the deterioration of the optical performance due to the generation of the clouding on the optical element 3 can be supplied so as to suppress the deterioration of the measurement accuracy of the position of the substrate 5 by the measuring device 30 to suppress the deterioration of the exposure performance.

Second Embodiment

Figure 4:
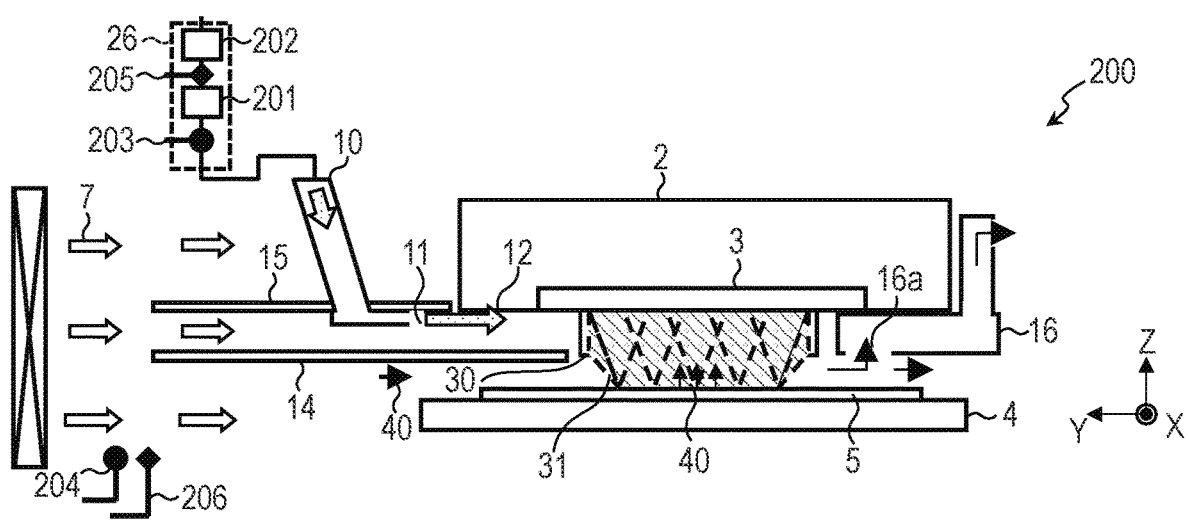
FIG. 4 is a partially enlarged view of the exposing apparatus according to a second embodiment of the present invention projected on the YZ cross section.

FIG. 4 shows a partially enlarged view of an exposing apparatus 200 according to a second embodiment of the present invention projected on the YZ cross section.

Note that the exposing apparatus 200 according to the present embodiment has the same structure as the exposing apparatus 100 according to the first embodiment except that a temperature adjusting unit 201 and a humidity adjusting unit 202 are newly provided, so that the same members are denoted by the same reference numerals and description thereof is omitted.

As shown in FIG. 4, the temperature adjusting unit 201 (temperature controller) and the humidity adjusting unit 202 (humidity controller) are provided in the air-conditioning unit 26 in the exposing apparatus 200 according to the present embodiment.

By providing the temperature adjusting unit 201 to adjust the temperature of the first gas 12, the temperature difference between the second gas 7 and the first gas 12 can be controlled with a high accuracy so as to be set between 0.01° C. and 0.001° C. or less, for example.

Further, by providing the humidity adjusting unit 202 to adjust the humidity of the first gas 12, the relative humidity difference between the second gas 7 and the first gas 12 can be controlled with a high accuracy so as to be set between 1% and 0.1% or less, for example.

In other words, the exposing apparatus 200 according to the present embodiment is provided with the temperature adjusting unit 201 and the humidity adjusting unit 202 capable of adjusting the temperature and the humidity of the first gas 12 based on the temperature and the humidity of the second gas 7.

As described above, the temperatures of the first gas 12 and the second gas 7 are adjusted so as to become substantially the same by providing the piping member through which the first gas 12 passes in the space to which the second gas 7 is supplied in order to exchange heat between the first gas 12 and the second gas 7 in the exposing apparatus 100 according to the first embodiment.

However, it is difficult to perform the control with a high accuracy so as to set the temperature difference between 0.01° C. and 0.001° C. or less in this structure.

Therefore, the temperature difference between them can be controlled with a high accuracy by providing the temperature adjusting unit 201, and the humidity difference between them can be also controlled with a high accuracy by providing the humidity adjusting unit 202 in the exposing apparatus 200 according to the present embodiment, as described above.

In order to adjust the temperature and the humidity of the first gas 12 by the temperature adjusting unit 201 and the humidity adjusting unit 202, a thermometer 203 and a hygrometer 205 for measuring the temperature and the humidity of the first gas 12 are provided in the air-conditioning unit 26 as shown in FIG. 4.

In addition, a thermometer 204 and a hygrometer 206 for measuring the temperature and the humidity of the second gas 7 are provided in the traveling path of the second gas 7.

The control by the temperature adjusting unit 201 and the humidity adjusting unit 202 may be performed such that the temperature and the humidity of the first gas 12 measured by the thermometer 203 and the hygrometer 205 become substantially the same as those of the second gas 7 measured by the thermometer 204 and the hygrometer 206.

The temperature adjusting unit 201 and the humidity adjusting unit 202 are provided in the air-conditioning unit 26 in the exposing apparatus 200 according to the present embodiment, but the present invention is not limited thereto.

That is, the temperature adjusting unit 201 and the humidity adjusting unit 202 may be provided outside the air-conditioning unit 26, for example, between the air-conditioning unit 26 and the first gas supplying mechanism 10, or in the first gas supplying mechanism 10.

Further, the thermometer 203 and the hygrometer 205 are provided in the air-conditioning unit 26 in the exposing apparatus 200 according to the present embodiment, but the present invention is not limited thereto.

That is, the thermometer 203 may be provided between the temperature adjusting unit 201 and the first gas supplying mechanism 10, and the hygrometer 205 may be provided between the humidity adjusting unit 202 and the first gas supplying mechanism 10.

In addition, the thermometer 203 and the hygrometer 205 may not be provided when they are not necessary depending on the configuration of the temperature adjusting unit 201 and the humidity adjusting unit 202.

As described above, the gas supplying port 11 for setting the traveling direction of the first gas 12 is provided such that the first gas 12 is supplied from the first gas supplying mechanism 10 toward the space between the optical element 3 and the optical path of the measurement light 31 in the exposing apparatus 200 according to the present embodiment.

Further, the thermometer 203 and the hygrometer 205 for measuring the temperature and the humidity of the first gas 12, and the thermometer 204 and the hygrometer 206 for measuring the temperature and the humidity of the second gas 7 are provided.

Furthermore, by providing the temperature adjusting unit 201 and the humidity adjusting unit 202, the temperature and the humidity of the first gas 12 are adjusted so as to be substantially the same as the measured temperature and humidity of the second gas 7.

From this structure, the first gas 12 for suppressing the deterioration of the optical performance due to the generation of the clouding on the optical element 3 is supplied so as to suppress the deterioration of the measurement accuracy of the position of the substrate 5, and the temperature and the humidity of the first gas 12 are controlled, thereby the deterioration of the exposure performance can be further suppressed.

According to the present invention, it is possible to provide the exposing apparatus which can suppress the deterioration of the exposure performance by supplying gas for suppressing the deterioration of the optical performance so as to suppress the deterioration of the measurement accuracy.

[Method for Manufacturing Article]

Next, a method for manufacturing an article by using the exposing apparatus according to the present invention is described.

The method for manufacturing an article, such as a semiconductor integrated circuit (IC) element, a liquid crystal display element and micro-electro-mechanical systems (MEMS), includes a step of exposing a substrate, such as a wafer or a glass substrate, on which a photoresist is applied by using the exposing apparatus according to the present invention.

Further, this method includes a step of developing the exposed substrate (the photoresist) and other known steps for processing the developed substrate.

Here, the other known steps include etching, a photoresist removal, dicing, bonding, packaging and the like.

In the method for manufacturing an article according to the present invention, an article with a high quality can be manufactured as compared with a conventional method.

Although the preferred embodiments have been described above, the present invention is not limited to these embodiments, and various modifications and changes can be made within the scope of the gist thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-143700, filed Aug. 27, 2020, which is hereby incorporated by reference herein in its entirety.

What is claimed is:

1. An exposing apparatus for exposing a substrate comprising:
   a projecting optical system configured to project exposure light to a substrate surface of the substrate;
   a measuring unit configured to measure a position of the substrate in a first direction perpendicular to the substrate surface which is exposed, by making measurement light obliquely incident on the substrate surface and receiving the measurement light reflected by the substrate surface; and
   a first gas supplying mechanism including a first gas supplying port for supplying first gas toward a space between the projecting optical system and the measurement light,
   wherein in a second cross section including the first direction and an optical path of the measurement light, a length in a direction orthogonal to the first direction of the first gas supplying port is longer than a length in the direction orthogonal to the first direction of an effective irradiated region of an optical element arranged closest to the substrate among a plurality of optical elements included in the projecting optical system.

2. The exposing apparatus according to claim 1, wherein the first gas supply port supplies the first gas to intersect with an optical path of the measurement light in a first cross section parallel to the substrate surface.

3. The exposing apparatus according to claim 2, wherein the first gas supply port supplies the first gas to form an angle between 45° and 90° with respect to the optical path in the first cross section.

4. The exposing apparatus according to claim 1, further comprising one or more second gas supplying mechanisms each including a second gas supplying port for supplying second gas toward at least the space,
   wherein the first gas supply port supplies the first gas so as to form an angle between 0° and 45° with respect to at least one of one or more traveling directions of the second gas.

5. The exposing apparatus according to claim 4, further comprising a flow straightening member configured to set the traveling direction of the second gas so as to form the angle between 0° and 45° with respect to the first gas between at least one of the one or more second gas supplying mechanisms and the space.

6. The exposing apparatus according to claim 4, further comprising a substrate stage configured to move in a second direction parallel to the substrate surface with holding the substrate,
   wherein at least one of the one or more second gas supplying mechanisms sets the traveling direction of the second gas so as not to be parallel to the second direction in a first cross section parallel to the substrate surface.

7. The exposing apparatus according to claim 4, further comprising a temperature controller configured to adjust a temperature of the first gas based on a temperature of the second gas.

8. The exposing apparatus according to claim 4, further comprising a humidity controller configured to adjust a humidity of the first gas based on a humidity of the second gas.

9. The exposing apparatus according to claim 4, wherein a gas composition of the first gas is the same as a gas composition of the second gas.

10. The exposing apparatus according to claim 4, wherein a gas composition of the first gas is different from a gas composition of the second gas.

11. The exposing apparatus according to claim 1, wherein the first gas is one of air, inert gas, and mixture gas including the air and the inert gas.

12. The exposing apparatus according to claim 11, wherein the air is humidity-controlled clean air.

13. The exposing apparatus according to claim 1, wherein at least a part of an exit surface of the optical element and an end surface of a housing of the projecting optical system at a side of the substrate between the first gas supply mechanism and the space forms a plane or a curved plane which is concave toward a side opposite to the substrate.

14. The exposing apparatus according to claim 1, further comprising an exhausting mechanism configured to suck gas in the space which is different from the space through which the measurement light passes.

15. The exposing apparatus according to claim 1, wherein the first gas supplying port supplies the first gas such that the first gas travels toward the substrate surface in a third cross section including the first direction.

16. A method for manufacturing an article, comprising:
exposing the substrate by using the exposing apparatus according to claim 1;
developing the exposed substrate; and
manufacturing an article from the developed substrate.

\* \* \* \* \*